United States Patent
Felsenthal et al.

(10) Patent No.: US 6,328,858 B1
(45) Date of Patent: Dec. 11, 2001

(54) MULTI-LAYER SPUTTER DEPOSITION APPARATUS

(75) Inventors: David Felsenthal, Marblehead; Chunghsin Lee, Lynnfield; Piero Sferlazzo, Marblehead, all of MA (US)

(73) Assignee: NEXX Systems Packaging, LLC, Wilmington, MA (US)

( * ) Notice: Subject to any disclaimer, the term of this patent is extended or adjusted under 35 U.S.C. 154(b) by 0 days.

(21) Appl. No.: 09/401,754

(22) Filed: Sep. 23, 1999

Related U.S. Application Data

(60) Provisional application No. 60/116,721, filed on Jan. 21, 1999, and provisional application No. 60/102,610, filed on Oct. 1, 1998.

(51) Int. Cl.$^7$ .................................................. C23C 14/35
(52) U.S. Cl. .............................. 204/192.15; 204/192.12; 204/298.11; 204/298.16; 204/298.26; 204/298.25; 204/298.28; 204/298.29
(58) Field of Search ........................ 204/192.12, 192.15, 204/298.09, 298.11, 298.16, 298.2, 298.22, 298.26, 298.25, 298.29, 298.35; 156/345; 118/719

(56) References Cited

U.S. PATENT DOCUMENTS

| | | |
|---|---|---|
| 3,902,615 | 9/1975 | Levy et al. ............................ 214/301 |
| 3,972,424 | 8/1976 | Levy et al. ............................ 214/1 Q |
| 4,008,815 | 2/1977 | Fisk .................................... 214/17 C |
| 4,437,961 | 3/1984 | Routh et al. .................... 204/192 EC |
| 4,586,743 | 5/1986 | Edwards et al. .................... 294/86.4 |
| 4,668,365 | 5/1987 | Foster et al. .................... 204/192.23 |
| 4,715,921 | 12/1987 | Maher et al. ........................ 156/345 |
| 4,785,962 | 11/1988 | Toshima ............................... 220/260 |
| 4,819,167 | 4/1989 | Cheng et al. .................... 364/167.01 |
| 4,842,683 | 6/1989 | Cheng et al. ........................ 156/345 |
| 4,872,947 | 10/1989 | Wang et al. ........................ 156/643 |
| 4,892,753 | 1/1990 | Wang et al. ........................... 427/38 |
| 4,911,597 | 3/1990 | Maydan et al. ...................... 414/217 |
| 4,951,601 | 8/1990 | Maydan et al. ...................... 118/719 |
| 4,962,441 | 10/1990 | Collins .................................. 361/234 |
| 5,000,113 | 3/1991 | Wang et al. ......................... 118/723 |
| 5,013,385 | 5/1991 | Maher et al. ........................ 156/345 |
| 5,046,909 | 9/1991 | Murdoch ............................. 414/225 |
| 5,102,495 | 4/1992 | Maher et al. ........................ 156/643 |
| 5,174,875 | * 12/1992 | Hurwitt et al. .................... 204/192.2 |

(List continued on next page.)

FOREIGN PATENT DOCUMENTS

| | | | |
|---|---|---|---|
| 0 492 114 A1 | 7/1992 | (EP) | ............................. C23C/14/34 |
| 01004472 | 1/1989 | (JP) | ............................. C23C/14/34 |
| 01123068 | 5/1989 | (JP) | ............................. C23C/14/34 |
| 01309961 | 12/1989 | (JP) | ............................. C23C/14/34 |
| 05171432 | 7/1993 | (JP) | ............................. C23C/14/34 |
| 06184741 | 7/1994 | (JP) | ............................. C23C/14/35 |

OTHER PUBLICATIONS

Haller et al., "High Frequency Performance of GE High Density Interconnect Modules," *IEEE Transactions on Components, Hybrids, and Manufacturing Technology*, vol. 16, No. 1, Feb. 15, 1993, pp. 1–5.

*Primary Examiner*—Nam Nguyen
*Assistant Examiner*—Steven H VerSteeg
(74) *Attorney, Agent, or Firm*—Testa, Hurwitz & Thibeault, LLP

(57) ABSTRACT

A multi-layer sputter deposition chamber or cluster tool module is described. The sputter deposition chamber includes a plurality of magnetrons mounted on a rotatable member that defines an aperture. A predetermined one of the plurality of magnetrons is positionable proximate to a substrate in the sputter deposition chamber. A transport mechanism transports the substrate in a path of the sputtered ions in a first and a second direction that is substantially opposite to the first direction.

23 Claims, 4 Drawing Sheets

U.S. PATENT DOCUMENTS

| | | | |
|---|---|---|---|
| 5,199,483 | 4/1993 | Bahng | 165/1 |
| 5,200,049 | 4/1993 | Stevenson et al. | 204/298.22 |
| 5,215,619 | 6/1993 | Cheng et al. | 156/345 |
| 5,224,809 | 7/1993 | Maydan et al. | 414/217 |
| 5,227,708 | 7/1993 | Lowrance | 318/640 |
| 5,280,983 | 1/1994 | Maydan et al. | 294/119.1 |
| 5,292,393 | 3/1994 | Maydan et al. | 156/345 |
| 5,308,431 | 5/1994 | Maher et al. | 156/345 |
| 5,315,473 | 5/1994 | Collins et al. | 361/234 |
| 5,344,542 | 9/1994 | Maher et al. | 204/298.15 |
| 5,345,999 | 9/1994 | Hosokawa | 165/80.2 |
| 5,354,715 | 10/1994 | Wang et al. | 437/238 |
| 5,355,066 | 10/1994 | Lowrance | 318/640 |
| 5,356,522 * | 10/1994 | Lal et al. | 204/192.15 |
| 5,360,996 | 11/1994 | Nulman et al. | 257/767 |
| 5,362,526 | 11/1994 | Wang et al. | 427/573 |
| 5,363,872 | 11/1994 | Lorimer | 137/1 |
| 5,371,042 | 12/1994 | Ong | 437/194 |
| 5,387,067 | 2/1995 | Grunes | 414/217 |
| 5,391,035 | 2/1995 | Krueger | 414/217 |
| 5,399,387 | 3/1995 | Law et al. | 427/574 |
| 5,427,666 | 6/1995 | Mueller et al. | 204/192.17 |
| 5,432,675 * | 7/1995 | Sorimachi et al. | 361/719 |
| 5,443,995 | 8/1995 | Nulman | 437/197 |
| 5,447,409 | 9/1995 | Grunes et al. | 414/744.6 |
| 5,460,689 | 10/1995 | Raaijmakers et al. | 156/643.1 |
| 5,469,035 | 11/1995 | Lowrance | 318/568.1 |
| 5,512,320 | 4/1996 | Turner et al. | 427/255 |
| 5,521,120 | 5/1996 | Nulman et al. | 437/190 |
| 5,527,439 * | 6/1996 | Sieck et al. | 204/192.22 |
| 5,527,605 | 6/1996 | Doessel et al. | 428/332 |
| 5,534,231 | 7/1996 | Savas | 216/67 |
| 5,538,390 | 7/1996 | Salzman | 414/786 |
| 5,556,147 | 9/1996 | Somekh et al. | 294/64.1 |
| 5,556,248 | 9/1996 | Grunes | 414/416 |
| 5,563,798 | 10/1996 | Berken et al. | 364/478.06 |
| 5,566,744 | 10/1996 | Tepman | 165/80.1 |
| 5,570,994 | 11/1996 | Somekh et al. | 414/786 |
| 5,579,718 | 12/1996 | Freerks | 118/733 |
| 5,607,009 | 3/1997 | Turner et al. | 165/48.1 |
| 5,607,776 | 3/1997 | Mueller et al. | 428/472 |
| 5,611,861 * | 3/1997 | Higashi | 118/719 |
| 5,618,338 | 4/1997 | Kurbayashi et al. | 106/26 R |
| 5,618,388 | 4/1997 | Seeser et al. | 204/192.12 |
| 5,630,690 | 5/1997 | Salzman | 414/217 |
| 5,630,916 | 5/1997 | Gerrish et al. | 204/192.2 |
| 5,630,917 | 5/1997 | Guo | 204/192.12 |
| 5,636,964 | 6/1997 | Somekh et al. | 414/786 |
| 5,643,366 | 7/1997 | Somekh et al. | 118/721 |
| 5,643,427 | 7/1997 | Kobayashi et al. | 204/298.2 |
| 5,656,902 | 8/1997 | Lowrance | 318/568.1 |
| 5,658,442 | 8/1997 | Van Gogh et al. | 204/298.12 |
| 5,674,786 | 10/1997 | Turner et al. | 437/225 |
| 5,678,980 | 10/1997 | Grunes et al. | 414/744.6 |
| 5,697,427 | 12/1997 | Ngan et al. | 165/80.1 |
| 5,697,750 | 12/1997 | Fishkin et al. | 414/217 |
| 5,730,801 | 3/1998 | Tepman et al. | 118/719 |
| 5,740,062 | 4/1998 | Berken et al. | 364/478.06 |
| 5,746,460 | 5/1998 | Marohl et al. | 294/1.1 |
| 5,746,897 | 5/1998 | Heimanson et al. | 204/298.2 |
| 5,747,360 | 5/1998 | Nulman | 437/189 |
| 5,764,012 | 6/1998 | Lowrance | 318/568.1 |
| 5,780,357 | 7/1998 | Xu et al. | 438/639 |
| 5,784,238 | 7/1998 | Nering et al. | 361/65 |
| 5,788,453 | 8/1998 | Donde et al. | 414/751 |
| 5,788,799 | 8/1998 | Steger et al. | 156/345 |
| 5,789,878 | 8/1998 | Kroeker et al. | 318/45 |
| 5,795,355 | 8/1998 | Moran | 29/25.01 |
| 5,799,860 | 9/1998 | Demaray et al. | 228/194 |
| 5,803,977 | 9/1998 | Tepman et al. | 118/728 |
| 5,810,937 | 9/1998 | Gupta et al. | 134/1.2 |
| 5,822,171 | 10/1998 | Shamouilian et al. | 361/234 |
| 5,824,197 | 10/1998 | Tanaka | 204/192.12 |
| 5,833,426 | 11/1998 | Marohl | 414/217 |
| 5,838,121 | 11/1998 | Fairbairn et al. | 318/45 |
| 5,844,195 | 12/1998 | Fairbairn et al. | 219/121.43 |
| 5,846,883 | 12/1998 | Moslehi | 438/711 |
| 5,851,602 | 12/1998 | Law et al. | 427/579 |
| 5,855,681 | 1/1999 | Maydan et al. | 118/719 |
| 5,861,086 | 1/1999 | Khurana et al. | 204/192.32 |
| 5,861,197 | 1/1999 | Law et al. | 427/579 |
| 5,871,588 | 2/1999 | Moslehi et al. | 118/730 |
| 5,871,811 | 2/1999 | Wang et al. | 427/248.1 |
| 5,877,086 | 3/1999 | Aruga | 438/653 |
| 5,879,127 | 3/1999 | Grunes et al. | 414/744.6 |
| 5,882,165 | 3/1999 | Maydan et al. | 414/217 |

* cited by examiner

MULTI-LAYER SPUTTER DEPOSITION APPARATUS

RELATED APPLICATIONS

This application claims the benefit of U.S. Provisional Application Ser. No. 60/116,721, filed Jan. 21, 1999 and U.S. Provisional Application Serial No. 60/102,610, filed Oct. 1, 1998. In addition, the application is related to U.S. patent application Serial No. 09/404,516, now U.S. Pat. No. 6,217,272 entitled "An In-Line Sputter Deposition System," filed this Sep. 23, 1999 and currently owned by the present assignee.

FIELD OF THE INVENTION

This invention relates in general to a semiconductor processing apparatus. In particular, this invention relates to a sputter deposition apparatus and to methods of operating a sputter deposition apparatus.

BACKGROUND INFORMATION

Most microelectronic devices are fabricated by depositing thin metal and dielectric films onto substrates such as silicon, gallium arsenide, and glass. Thin metals and dielectrics are deposited in a vacuum chamber by numerous techniques known in the art such as sputtering, evaporation, and Chemical Vapor Deposition (CVD). Sputtering is a versatile deposition technique because it can be used to deposit a wide variety of materials at relatively high deposition rates. Sputtering is particularly useful for depositing multiple layers of materials.

Sputtering systems typically bias a target comprising the material to be sputtered at a relatively high voltage, typically about −500 volts, in a vacuum chamber filled with an inert gas such as argon, at pressures ranging from 0.1 mtorr to 100 mtorr. The bias potential induces a breakdown of the gas and the formation of a plasma glow discharge. The ions in the plasma are accelerated by the negative potential into the target thereby producing secondary atomic emission, which sputters material on a substrate placed in the path of the sputtered ions. Magnetic fields are typically used to confine the plasma in order to increase the sputtering rate.

It is sometimes desirable to deposit multiple layers of different material on substrates without removing the substrates from the process chamber. However, most prior art sputtering systems are designed to deposit one material, which may be a single metal or dielectric or a combination of several metals or dielectrics. Thus, if multiple layers of different materials have to be deposited on substrates, the sputtering systems usually need to be reconfigured and the substrates have to be cycled from atmosphere to vacuum. Exposing the substrates to atmospheric pressure between depositions may result in the formation of an undesirable interface layer.

It is desirable to process multiple substrates simultaneously in order to increase process throughput and thus reduce the manufacturing costs of the microelectronic devices. Modern semiconductor processing tools, such as cluster tools, process multiple batches of substrates simultaneously. Cluster tools comprise a plurality of process chambers that are clustered around a central platform. A transport mechanism or robot moves the substrates between the various process chambers.

Typically, each process chamber attached to the cluster tool performs a single task and can be operated independent of the other process chambers. For example, the individual process chambers may clean substrates before processing, etch substrates or a film deposited on substrates, or deposit metal or dielectric films on substrates. Typically, the process chambers are configured to deposit only one metal or dielectric film. Consequently, if the process requires multiple layers of metals or dielectric films, the multiple layers are sequentially deposited in different process chambers. State-of-the-art cluster tools typically have between four and eight process chambers. Therefore, cluster tools have a limited capability to deposit multi-layer film coatings.

Some multi-layer films need to be deposited sequentially in one process chamber. Moving the substrates from one process chamber to another process chamber usually changes the pressure and temperature of the substrates. These pressure and temperature changes may result in the formation of an undesirable interface layer between the films.

SUMMARY OF THE INVENTION

An object of the present invention is to provide a sputter deposition tool or module for a cluster tool that deposits multiple layers of metal or dielectric films on substrates in a single deposition chamber. It is another object of the present invention to provide a method of chromium/copper phase-in deposition for the sputter deposition tool and cluster tool module of the present invention.

It is a principle discovery of the present invention that a sputter deposition system or cluster tool module can be constructed with a plurality of magnetrons mounted on a rotatable member that defines an aperture. It is another principle discovery of the present invention that chromium/copper phase-in deposition can be achieved using the sputter deposition system or cluster tool module of the present invention.

Accordingly, the present invention features a multi-layer sputter deposition system that includes a plurality of magnetrons mounted on a rotatable member that defines an aperture. Sputtering targets are positioned proximate to each of the plurality of magnetrons. At least one of the sputtering targets may comprise at least two materials. The rotatable member may include a ferrofluidic conduit that receives at least one of the electrical wires and cooling fluid. The rotatable member may also be rotatably supported by a bearing. In one embodiment, the aperture is maintained at substantially atmospheric pressure. A predetermined one of the plurality of magnetrons is positionable proximate to a substrate in the sputter deposition chamber. At least one shield may be included to prevent sputtered material from contaminating the magnetrons.

The multi-layer sputter deposition system also includes a transport mechanism that transports the substrate in the path of the sputtered ions in a first and a second direction. The second direction is substantially opposite to the first direction. In one embodiment, a processor is in electrical communication with the rotatable member and instructs the rotatable member to position a predetermined one of the plurality of magnetrons proximate to a substrate. The processor may also be in electrical communication with the transport mechanism and may instruct the transport mechanism to transport the substrate proximate to a predetermined one of the plurality of magnetrons.

The present invention also features an apparatus for simultaneously processing substrates. The apparatus includes a plurality of chambers positioned around a central aperture. A substrate transport mechanism positioned in the aperture moves at least one substrate into and out of each of the chambers. The apparatus includes a substrate storage chamber positioned around the central aperture. The storage chamber stores at least one substrate prior to processing and at least one substrate after processing. The apparatus also includes at least one process chamber positioned around the central aperture. The process chamber may be any process chamber known in the art. For example, the process chamber may be a cleaning chamber, an etching chamber, or a deposition chamber.

The apparatus also includes a multi-layer sputter deposition chamber that includes a plurality of magnetrons mounted on a rotatable member. A predetermined one of the plurality of magnetrons is positionable proximate to a substrate in the second process chamber. A transport mechanism transports the substrates proximate to the predetermined one of the plurality of magnetrons in a first and a second direction.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION OF THE INVENTION

Figure 1:
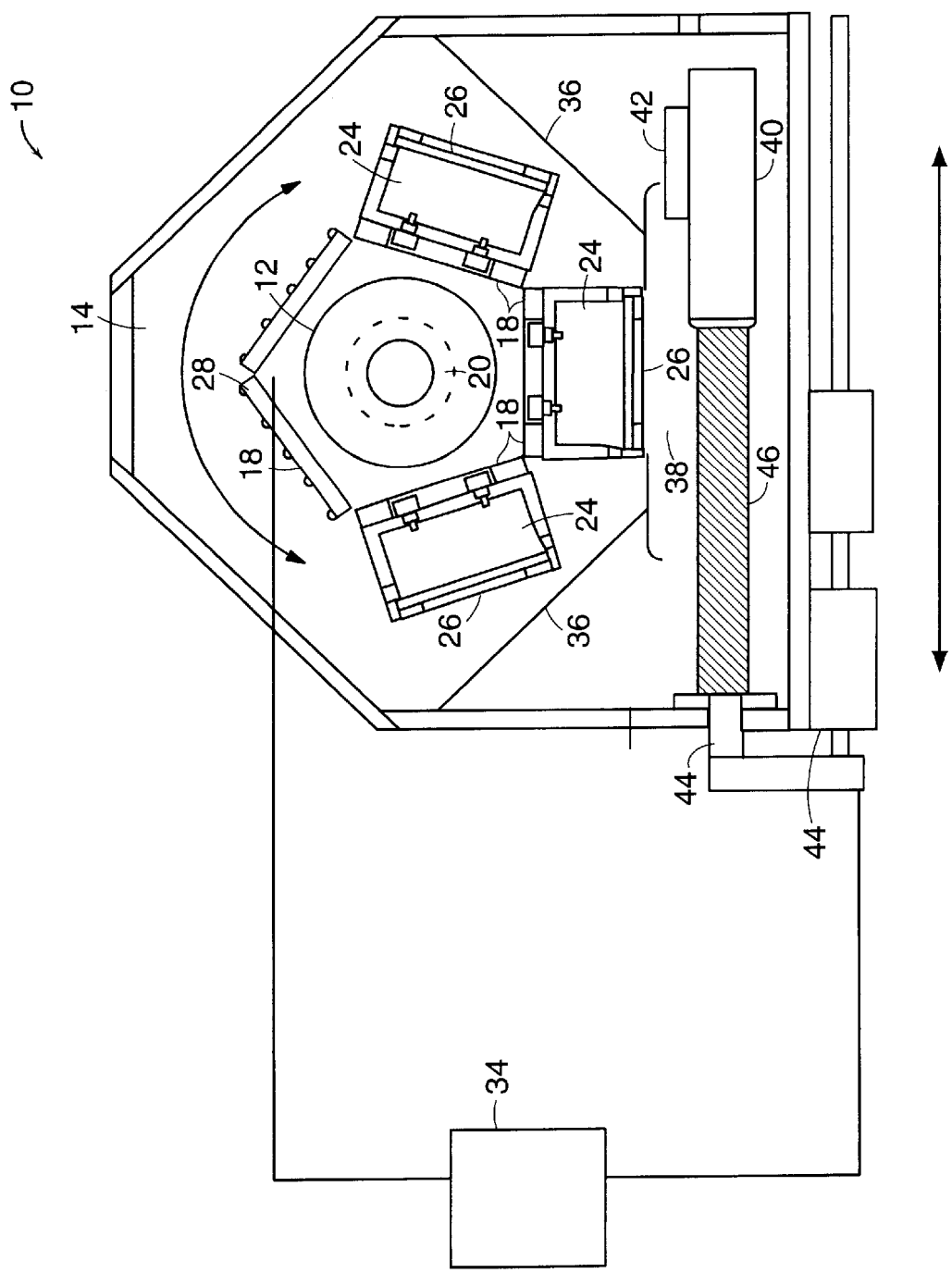
FIG. 1 is a side cross-sectional view of one embodiment of a sputter disposition system according to the present invention.
Figure 4:
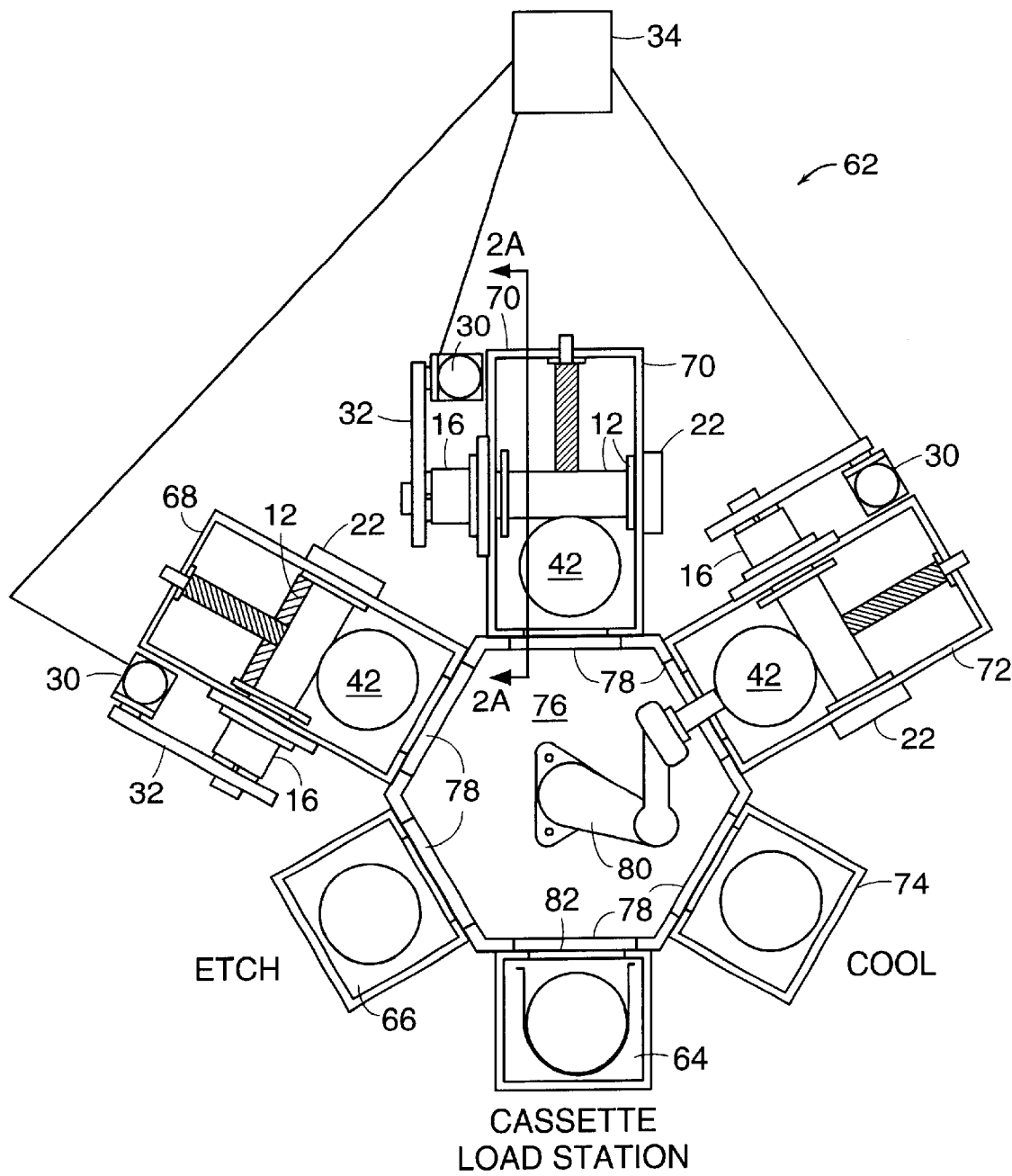
FIG. 4 illustrates a semiconductor processing cluster tool that includes a module comprising the sputtering system of the present invention.

FIG. 1 is a side cross-sectional view of one embodiment of a sputter disposition system 10 according to the present invention. A rotatable member, such as a drum 12, is positioned in the chamber 14. The drum 12 rotates about a bearing 16 (FIG. 4). In one embodiment, the drum 12 defines a plurality of relatively flat surfaces or faces 18 on the outer surface of the drum 12. For example, the drum 12 may be pentagonal in shape with five faces 18.

In one embodiment, the rotatable member defines an aperture 20. The rotatable member may include a ferrofluidic conduit 22 (FIG. 4) in the aperture 20 for passing electrical wires and cooling fluid pipes from a power supply and fluid source into the drum 12. The ferrofluidic conduit 22 also provides a vacuum seal between the aperture 20, which is maintained at substantially atmospheric pressure, and the faces 18 of the drum 12, which are maintained at high vacuum in the sputter deposition chamber 14.

In one embodiment, each of the plurality of magnetrons 24 is positioned on one of the relatively flat surfaces 18 of the drum 12. Sputtering targets 26 are positioned proximate to each of the plurality of magnetrons 24. The width of the sputtering targets usually exceeds the diameter of the substrates. The sputter targets 26 may be compound sputtering targets that comprise at least two different materials to be sputtered. Electrical wires and cooling fluid pipes are fed through the ferrofluidic conduit 22. In one embodiment, at least one face 18 of the drum 12 includes a removable flange 28 for providing access to the magnetrons for configuration, maintenance and repair. In one embodiment, the drum 12 is coupled to a motor 30 (FIG. 4) either directly or by a drive belt 32 (FIG. 1). A processor 34 is in electrical communication with the motor 30 and may instructs the drum 12 to position a predetermined one of the plurality of magnetrons 24 under a substrate 42.

A shield 36 may be positioned in the sputter deposition chamber 14 to prevent sputtered material from contaminating system components such as the sputtering chamber 14, drum 12, magnetrons 24, and unused sputtering targets. In one embodiment, the shield 36 defines an aperture 38 that is dimensioned to receive a sputtering target 26.

A substrate holder 40 is positioned below the drum 12 that supports at least one substrate 42 for sputter deposition. The substrate holder 40 may be an electrostatic chuck, which is commonly used in the semiconductor industry. The substrate holder 40 may include cooling channels for carrying cooling fluid. The cooling fluid, such as water, passes through the cooling channel and removes heat from the substrates being processed.

A transport mechanism 44 is attached to the substrate holder 40. The transport mechanism transports the substrate holder across the sputtering target 26. The transport mechanism 44 may be a linear drive mechanism attached to a bellows 46 that transports the substrate holder 40 in a first direction and a second direction that is substantially opposite to the first direction. The processor 34 may be in electrical communication with the transport mechanism 44 and instruct the transport mechanism to transport the substrates proximate to a predetermined one of the plurality of magnetrons 24.

The present invention also features a method of sputter depositing multiple layers of material onto a substrate. The method includes positioning a first sputtering apparatus comprising a first sputtering target proximate to a substrate in a sputter deposition chamber. The first sputtering apparatus is activated thereby sputtering first target material onto the substrate. The first target material may be sputtered from a compound sputtering target. The substrate is transported in a path of sputtered first target material in a first direction and then in a second direction that is substantially opposite to the first direction.

A second sputtering apparatus comprising a second sputtering target is then positioned proximate to the substrate in the sputter deposition chamber. The second sputtering apparatus is activated thereby sputtering second target material onto the substrate. The second target material may be sputtered from a compound sputtering target. The substrate is transported in a path of sputtered second target material in the first direction and then in a second direction that is substantially opposite to the first direction.

The substrates can be transported in the path of sputtered first and second target material any number of times in order to achieve the desired film uniformity. In addition, the transport rate can be adjusted to achieve the desired film uniformity.

Figure 2:
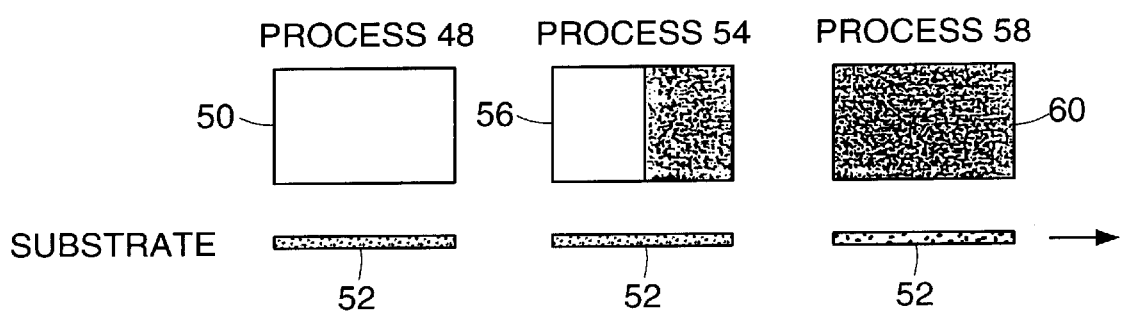
FIG. 2 illustrates a schematic view of a sequential phase-in deposition using the sputtering deposition system of the present invention.

FIG. 2 illustrates a schematic view of a sequential phase-in deposition using the sputtering deposition system of the present invention. Three sequential sputtering processes are illustrated. The first sputtering process 48 shows a first sputtering target 50 above a substrate 52. The substrate 52 is transported in a path of the sputtered material. The second sputtering process 54 shows a compound sputtering target 56 above the substrate 52. By compound sputtering target we mean that the sputtering target comprises at least two different materials. The substrate 52 is transported in a path of the sputtered material, which is at least two different sputtered materials. The third sputtering process 58 shows a third sputtering target 60 above the substrate 52. The substrate 52 is transported in a path of the sputtered material.

The substrate 52 may be transported across the sputtering targets in only one direction. Alternatively, the substrate may be transported in a first and a second direction, where the second direction is substantially opposite the first direction, as described in connection with the sputtering deposition system 10 of FIG. 1.

In one embodiment of the invention, the sequential phase-in deposition is a sequential chromium/copper phase-in deposition. The first sputtering target is a chromium sputtering target. The compound sputtering target is a chromium/copper sputtering target. The second sputtering target is a copper sputtering target.

The present invention also features a method of phase-in deposition using the sputtering deposition system of the present invention. In one embodiment of the invention, the method of phase-in deposition comprises a method of chromium and copper phase-in deposition.

The method includes positioning a first sputtering apparatus with a first sputtering target proximate to a substrate in a sputter deposition chamber. The first sputtering apparatus is activated thereby sputtering a first target material onto the substrate. The substrate is then transported in a path of the first sputtered material. The substrates may be transported in a first direction only or in a first and a second direction, where the second direction is substantially opposite the first direction.

A second sputtering apparatus with a compound sputtering target comprising the first target material and a second target material is positioned proximate to the substrate in the sputter deposition chamber. The second sputtering apparatus is activated thereby sputtering the first and the second target material. The substrate is transported in a path of the first and second sputtered material. The substrates may be transported in a first direction only or in a first and a second direction, where the second direction is substantially opposite the first direction. Sputtering with the compound sputtering target allows the gradual introduction of the first and second target materials with any desired proportion.

A third sputtering apparatus with a third sputtering target comprising the second target material is positioned proximate to the substrate in the sputter deposition chamber. The third sputtering apparatus is activating thereby sputtering the second target material onto the substrate. The substrates may be transported in a first direction only or in a first and a second direction, where the second direction is substantially opposite the first direction.

Figure 3:
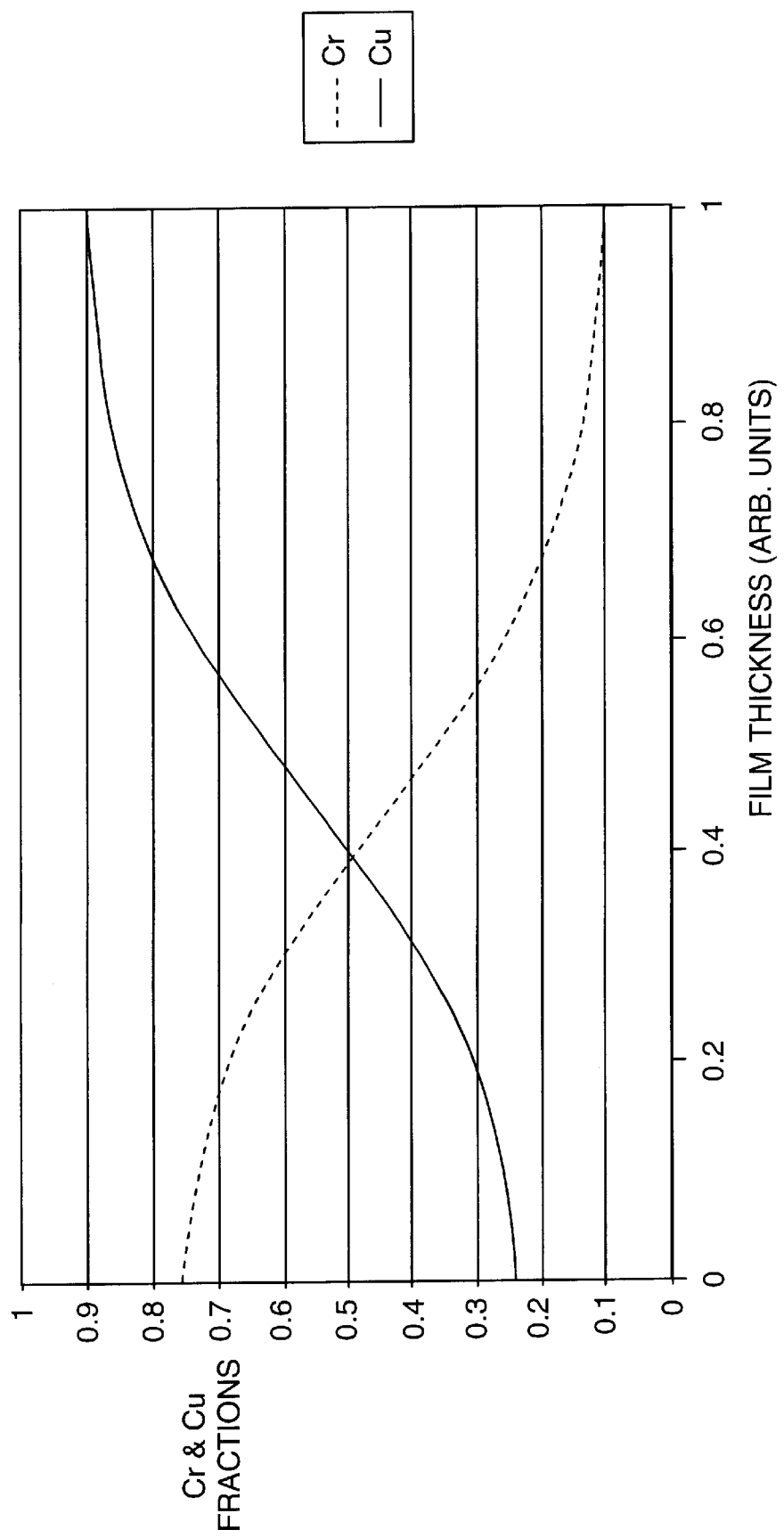
FIG. 3 is a graph illustrating chromium and copper distribution as a function of film thickness for a chromium/copper sequential phase-in deposition according to the present invention.

FIG. 3 is a graph illustrating the chromium and copper distribution as a function of film thickness for a chromium/copper sequential phase-in deposition according to the present invention. The fraction of chromium in the deposited film gradually decreases while the fraction of copper in the deposited film gradually increases. For the process illustrated in FIG. 3, the cross over point where the fractions of chromium and copper are each approximately 50% corresponds to a film thickness of approximately 40%. By varying the process parameters, the sputtering rate for each of the three depositions can be modified to obtain a film with the desired fractions of chromium and copper.

FIG. 4 illustrates a semiconductor processing cluster tool 62 that includes a module comprising the sputtering system of the present invention. The cluster tool 62 comprises a plurality of modules 64–74 that are positioned around a central chamber 76. Each of the plurality of modules 64–74 and the central chamber 76 are coupled to a vacuum pump (not shown) so they can be evacuated to high vacuum. Each of the plurality of modules 64–74 includes a valve 78 that isolates the module from the central chamber 76 and that allows the at least one substrate to be transported into and out of the module.

A substrate transport mechanism 80 is positioned in the central chamber 76. In one embodiment, the transport mechanism 80 is a wafer handling robot commonly used in the semiconductor industry. The transport mechanism 80 moves one or a batch of substrates from any of the modules to any of the other modules.

Typically the modules 64–74 are arranged to perform a sequential process. The modules 64–74 of the cluster tool 62 are arranged in a clockwise order to perform a multilayer sputter deposition using the sputtering system of the present invention. The cluster tool 62 includes a load lock module 64 that is adapted to receive at least one substrate. The load lock module may receive a batch of substrates in any type of wafer cassette known in the art. The load lock module 64 includes a gate valve 82 that vents the module 64 to atmospheric pressure in order to load and unload the at least one substrate. A plasma etching or plasma cleaning module 66 is positioned adjacent to the load lock module in a clockwise direction.

A plurality of sputter deposition modules 68–72 according to the present invention is positioned adjacent to the plasma etching module 66 in a clockwise direction. The sputter deposition modules 68–72 include the sputter deposition system described in connection with FIG. 1. The sputter deposition modules of FIG. 4 illustrate a top-view of the sputter deposition system of FIG. 1. The cross-sectional viewing direction of FIG. 1 is indicated for one of the modules in FIG. 4 (see reference sign 2A). The modules include the drum 12 supporting the magnetrons 24 and sputtering targets 26. A motor 30 having a belt drive 32 is attached to the drum 12 and rotates the drum 12 to position the desired sputtering target 26 over the substrate 42 to be processed. A processor 34 is connected to each of the motors 30 so the sputter deposition can be accomplished according to a predetermined program.

A cooling module 74 is positioned after the sputter deposition modules 68–72 in a clockwise direction. The cooling module allows the process substrates to cool before removing them from the cluster tool 62 thereby avoiding the formation of undesirable oxide layers.

For example, the cluster tool 62 of FIG. 4 may be used to deposit multiple multi-layer films on a batch of semiconductor substrates. The batch of substrates are loaded in the load lock module 64 and pumped down to high vacuum. The substrate transport mechanism 80 moves the batch of substrates from the load lock module 64 to the plasma etch or plasma cleaning module 66 where the substrates are etched or cleaned for deposition. The substrate transport mechanism 80 then moves the batch of substrates from the module 66 to at least one of the sputter deposition modules 68–72 for at least one multi-layer deposition according to the present invention.

The batch of substrates are then transported to the cooling module 74 where they remain under vacuum conditions until the temperature is sufficiently low for them to be removed from the cluster tool. Alternatively, the batch of substrates may be transported to the cooling module 74 in-between multi-layer depositions. The batch of substrates is then transported back to the load lock module 64. The load lock module is brought up to atmospheric pressure and then the batch of substrates is removed.

There are numerous advantages to using the sputter deposition system of the present invention in a cluster tool. One advantage is that such a cluster tool can deposit numerous multi-layer films simultaneously. Another advantage is that such a cluster tool has reduced down time. The sputter deposition modules of the present invention can be configured or serviced while operating the module.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A multi-layer sputter deposition chamber comprising:
   a) a plurality of magnetrons mounted on a rotatable member, wherein a predetermined one of the plurality of magnetrons is positionable proximate to at least one substrate in the sputter deposition chamber;
   b) a transport mechanism that transports the at least one substrate proximate to the predetermined one of the plurality of magnetrons in a path of the sputtered ions in a first and a second direction that is substantially opposite to the first direction; and
   c) a substrate holder attached to the transport mechanism for supporting the at least one substrate.

2. The deposition chamber of claim 1 further comprising a processor in electrical communication with the rotatable member, wherein the processor instructs the rotatable member to position a predetermined one of the plurality of magnetrons proximate to a substrate.

3. The deposition chamber of claim 1 further comprising a processor in electrical communication with the transport mechanism, wherein the processor instructs the transport mechanism to transport the substrate proximate to a predetermined one of the plurality of magnetrons.

4. The deposition chamber of claim 1 further comprising a shield that prevents sputtered material from reaching the plurality of magnetrons.

5. The deposition chamber of claim 1 further comprising a sputtering target positioned proximate to each of the plurality of magnetrons.

6. The deposition chamber of claim 5 wherein at least one of the sputtering targets comprises at least two materials.

7. The deposition chamber of claim 1 wherein the substrate holder supports a plurality of substrates for simultaneous sputtering of ions on the plurality of substrates.

8. The deposition chamber of claim 1 wherein the transport mechanism extends the substrate holder prior to sputtering, and retracts the substrate holder after sputtering.

9. A multi-layer sputter deposition chamber comprising:
   a) a plurality of magnetrons mounted on a rotatable member, wherein a predetermined one of the plurality of magnetrons is positionable proximate to a substrate in the sputter deposition chamber, and the rotatable member defines an aperture; and
   b) a transport mechanism that transports the substrate proximate to the predetermined one of the plurality of magnetrons in a path of the sputtered ions in a first and a second direction that is substantially opposite to the first direction.

10. The deposition chamber of claim 9 wherein the aperture is maintained at substantially atmospheric pressure.

11. The deposition chamber of claim 9 wherein the rotatable member that defines the aperture comprises a ferrofluidic conduit that receives at least one of electrical wires and cooling fluid.

12. The deposition chamber of claim 9 further comprising a bearing that rotatably supports the rotatable member.

13. A method of sputter depositing multiple layers of material onto a substrate, the method comprising:
   a) positioning a first sputtering apparatus comprising a first sputtering target proximate to a substrate in a sputter deposition chamber;
   b) activating the first sputtering apparatus thereby sputtering first target material onto the substrate;
   c) transporting the substrate in a path of sputtered first target material in a first direction;
   d) transporting the substrate in a path of sputtered first target material in a second direction that is substantially opposite to the first direction;
   e) positioning a second sputtering apparatus comprising a second sputtering target proximate to the substrate in the sputter deposition chamber;
   f) activating the second sputtering apparatus thereby sputtering second target material onto the substrate;
   g) transporting the substrate in a path of sputtered second target material in the first direction; and
   h) transporting the substrate in a path of sputtered second target material in the second direction that is substantially opposite to the first direction.

14. The method of claim 13 wherein at least one of positioning the first sputtering apparatus and positioning the second sputtering apparatus comprises positioning one of a plurality of magnetrons mounted on a rotatable member in the sputter deposition chamber.

15. The method of claim 13 wherein at least one of sputtering the first target material and sputtering the second target material comprises sputtering material from a compound sputtering target.

16. A method of phase-in deposition, the method comprising the steps of:
   a) positioning a first sputtering apparatus with a first sputtering target proximate to a substrate in a sputter deposition chamber;
   b) activating the first sputtering apparatus thereby sputtering a first target material onto the substrate;
   c) transporting the substrate in a path of sputtered first target material;
   d) positioning a second sputtering apparatus with a compound sputtering target comprising the first target material and a second target material proximate to the substrate in the sputter deposition chamber;
   e) activating the second sputtering apparatus thereby sputtering first and second target material onto the substrate;
   f) transporting the substrate in a path of first and second target material ions;
   g) positioning a third sputtering apparatus with a third sputtering target comprising the second target material proximate to the substrate in the sputter deposition chamber;

h) activating the third sputtering apparatus thereby sputtering second target material onto the substrate; and i) transporting the substrate in a path of second target material ions.

17. The method of claim 16 wherein the first material comprises chromium and the second material comprises copper.

18. The method of claim 16 wherein the step of activating the second sputtering apparatus further comprises sputtering first and second target material in a predetermined proportion onto the substrate.

19. An apparatus for simultaneously processing substrates, the apparatus comprising:

a) a substrate storage chamber positioned around a central aperture, the storage chamber storing at least one substrate prior to processing and at least one substrate after processing;

b) at least one process chamber positioned around the central aperture;

c) a multi-layer sputter deposition chamber positioned around the central aperture, the chamber comprising:

i) a plurality of magnetrons mounted on a rotatable member, wherein a predetermined one of the plurality of magnetrons is positionable proximate to a substrate in the multi-layer sputter deposition chamber; and ii) a transport mechanism that transports the substrate proximate to the predetermined one of the plurality of magnetrons in a first and a second direction; and d) a second transport mechanism positioned in the aperture that moves at least one substrate into and out of the substrate storage chamber and the multi-layer sputter deposition chamber.

20. The apparatus of claim 19 wherein the rotatable member defines an aperture.

21. The apparatus of claim 19 wherein the at least one process chamber comprises an etching chamber.

22. The apparatus of claim 19 wherein the at least one process chamber comprises a plasma cleaning chamber.

23. The apparatus of claim 19 wherein the at least one process chamber comprises a deposition chamber.

* * * * *